US009829793B2

(12) United States Patent
Yang et al.

(10) Patent No.: US 9,829,793 B2
(45) Date of Patent: Nov. 28, 2017

(54) FABRICATION OF FREE STANDING MEMBRANES AND USE THEREOF FOR SYNTHESIS OF NANOPARTICLE PATTERNS

(71) Applicants: Jun Yang, London (CA); Tingjie Li, London (CA)

(72) Inventors: Jun Yang, London (CA); Tingjie Li, London (CA)

(73) Assignee: THE UNIVERSITY OF WESTERN ONTARIO, London, Ontario (CA)

(*) Notice: Subject to any disclaimer, the term of this patent is extended or adjusted under 35 U.S.C. 154(b) by 0 days.

(21) Appl. No.: 14/349,814

(22) PCT Filed: Oct. 3, 2012

(86) PCT No.: PCT/CA2012/050697
§ 371 (c)(1),
(2) Date: Apr. 4, 2014

(87) PCT Pub. No.: WO2013/049936
PCT Pub. Date: Apr. 11, 2013

(65) Prior Publication Data
US 2014/0248429 A1 Sep. 4, 2014

Related U.S. Application Data

(60) Provisional application No. 61/542,885, filed on Oct. 4, 2011.

(51) Int. Cl.
G03F 7/20 (2006.01)
B01D 67/00 (2006.01)
(Continued)

(52) U.S. Cl.
CPC ....... G03F 7/2002 (2013.01); B01D 67/0034 (2013.01); B05D 5/00 (2013.01);
(Continued)

(58) Field of Classification Search
CPC .......... B01D 67/0034; B01D 2323/345; B05D 5/00; G03F 7/002
See application file for complete search history.

(56) References Cited

U.S. PATENT DOCUMENTS 4,188,273 A * 2/1980 Sano ................... C08J 5/18
204/157.63
5,518,864 A * 5/1996 Oba et al. .................... 430/325
(Continued)

FOREIGN PATENT DOCUMENTS

WO 01/21285 3/2001
WO 2009/115938 9/2009

OTHER PUBLICATIONS

International Search Report and Written Opinion dated Feb. 8, 2013 for International Application No. PCT/CA2012/050697.

Primary Examiner — Michael Wieczorek
Assistant Examiner — Bradford Gates
(74) Attorney, Agent, or Firm — Quarles & Brady LLP

(57) ABSTRACT

The present disclosure discloses a method of fabrication of free standing open pore membranes with uniform pore size and shape and ordered pore distribution, and its use for synthesis of nanoparticle patterns. The method includes applying a photoresist layer to the top surface of a substrate, heating the photoresist layer for a period of time, and exposing the photoresist layer to a dose of ultraviolet radiation through a mask having a predetermined pattern. The dose of ultraviolet radiation is controlled in intensity and time and the photoresist layer is exposed such that a top portion of the photoresist layer through which the dose of ultraviolet radiation enters the photoresist layer undergoes greater cross linking than a bottom portion of the photoresist layer immediately adjacent to the top surface of the substrate such that a cross linking gradient develops through a thickness of the photoresist layer. The mask is removed and the (Continued)

membrane is readily detached from the top surface of the substrate since the portion of the membrane adjacent to the top surface is less cross linked than the top surface of the membrane. The detached membrane forms a free standing patterned membrane having a preselected pattern of open pores. The method can be used with positive photoresist materials as well when deposited on a UV transparent substrate so that the photoresist can be exposed to UV from its top with photomask and UV exposure from its back of the transparent substrate without the photomask.

3 Claims, 7 Drawing Sheets

(51) Int. Cl.
*B05D 5/00* (2006.01)
*G03F 7/38* (2006.01)

(52) U.S. Cl.
CPC .... *B01D 2323/30* (2013.01); *B01D 2323/345* (2013.01); *B01D 2325/08* (2013.01); *G03F 7/38* (2013.01); *Y10T 428/24496* (2015.01)

(56) References Cited

U.S. PATENT DOCUMENTS

| | | | | |
|---|---|---|---|---|
| 6,007,968 | A | * | 12/1999 | Furukawa et al. ............ 430/314 |
| 7,585,421 | B2 | | 9/2009 | Lagarde et al. |
| 9,421,500 | B2 | * | 8/2016 | Kornely ............. B01D 39/1692 |
| 2002/0006588 | A1 | * | 1/2002 | Afromowitz ......... G03F 7/2022 430/322 |
| 2005/0221232 | A1 | * | 10/2005 | Baldwin ................ H05K 3/048 430/312 |
| 2009/0257920 | A1 | * | 10/2009 | Facer et al. ..................... 422/99 |
| 2012/0183946 | A1 | * | 7/2012 | Tang ....................... A61M 1/34 435/2 |

* cited by examiner

FABRICATION OF FREE STANDING MEMBRANES AND USE THEREOF FOR SYNTHESIS OF NANOPARTICLE PATTERNS

CROSS-REFERENCE TO RELATED APPLICATIONS

This application is the National Phase application of No. PCT/CA2012/050697, filed on Oct. 3, 2012, in English, which claims priority to U.S. Provisional Application No. 61/542,885, entitled "FABRICATION OF FREESTANDING MEMBRANES AND USE THEREOF FOR SYNTHESIS OF NANOPARTICLE PATTERNS," filed on Oct. 4, 2011, the entire contents of both applications are incorporated herein by reference.

FIELD

The present invention relates to a method of fabrication of free standing membranes with open pore structures and synthesis of nanoparticle patterns using these membranes.

BACKGROUND

Membrane with uniform pore size and shape, and ordered pore distribution are very desirable because of their superior performance compared to conventional membranes in many applications such as filtration, template synthesis, and catalytic reaction. These characteristics of membranes have not yet been satisfactorily achieved by existing membrane fabrication methods including bombardment and wet etching for track-etched membranes, electrochemical etching for anodic alumina membranes, replication of polymer membranes from molding templates, dissolution of embedded particles to yield porous membranes, and the direct photolithographic method. The photolithographic method can pattern photoresist membranes with well-defined and ordered pores on substrates, which is the nature of photolithography. However, in previous photolithographic methods, the membranes cannot be easily detached from substrates, so that additional sacrificial layers are required. Not only are the cost and complexity of the fabrication process increased, but the quality of membranes produced this way is impaired as well when the sacrificial layer is dissolved either in corrosive solution, or by lateral isotropic etching.

Commercially available track-etch membranes (Nuclepore, Poretics, Osmonics and Millipore), prepared by bombardment and wet etching suffer from difficultly to have good control over the morphology and pore size of the pores. Except for the expensive photolithographic method mentioned above, typically porous membranes made using known methods suffer from a poor coefficient of variation (CV), meaning a wide variation in pore size in all direction, slanted walls through the thickness of the membrane, variation in pore diameter from one pore to the other etc., such that these membranes with poor CV cannot be used for precise analytic applications.

Anodic alumina (Whatman Anapore and Anotech Separation) offers a cheaper and morphologically better alternative to track-etch membranes, but involve handling dangerous reagent. In lab, reactive ion etching (RIE) can fabricate freestanding, perforated membranes with three complicated steps: vapor deposition, photolithography and RIE. In contrast, soft lithography provides a simple way that involves spin-coating a thin layer of liquid prepolymer on a substrate that contains microposts. However, the surface tension of the liquid prepolymer around the microposts leads to uneven surface of the membrane.

It would therefore be advantageous to provide a method of fabrication of free standing open pore membranes having a low CV and capable of providing good quality pores with straight parallel walls through the thickness of the membrane as well as pore diameters that are the same across the membrane. It would also be very useful to provide a method of producing porous membranes in which the pore shape and morphology can be carefully controlled and tuned in order to provide shape selective porous membranes.

SUMMARY

Herein is disclosed a one-step photolithographic method of producing free standing self-detached ultrathin membranes with open-pores array of well-defined patterns using only conventional photolithography. By controlling the UV dose (intensity) and time of exposure of the photoresist layer, free standing membranes can be produced within the photoresist layer in which the exposed portion of the photoresist are not adhered to the substrate on which the photoresist is deposited. The crosslinked part of photoresist forms the body of the membrane with well-defined patterns reflective of the mask being used, while the uncrosslinked part of the photoresist layer adjacent to the substrate surface remains soluble during the process of photoresist development. This mechanism makes membranes easy to detach from substrates. Since the UV dose is controlled, the membrane thickness can be tuned by adjusting the depth where crosslinking occurs in photoresist. This method can be applied to any photosensitive material of choice, which may be selected based a need for certain desired material properties such as hydrophobicity, elasticity and ability for surface functionalization.

These membranes with uniform pore size and shape, and ordered pore distribution are ideal because of its superior performance to conventional membranes in many applications such as filtration, template synthesis and catalytic reaction. Such membranes have not yet been made by existing membrane fabrication methods. Membranes made using the present method exhibit a coefficient of variation (CV) of pore size of only 0.15% compared to a CV value in a range of 15%-20% for conventional membranes. Using this method it is possible to produce membranes with specially tailored sizes and shapes of pores on various substrates. Importantly, due to the self-detaching mechanism, the membranes are flat, and free of residual stress and deformation.

With accurate control of pore shape, such membranes enable filtration by shape compared to filtration by size only for majority of membranes. In summary, this simple photolithographic method opens a new avenue to fabricate high-performance membranes that enables broad applications in filtration, separation, sorting and even new means of filtration like filtration by shape.

Embodiments are disclosed which provide a method of fabrication of free standing open pore membranes with uniform pore size and shape and ordered pore distribution, and its use for synthesis of nanoparticle patterns.

There is provided a method of fabrication of free standing polymeric membranes using negative photoresist, comprising the steps of:

a) providing a substrate having a top surface and applying a negative photoresist layer to the top surface of the substrate;

b) heating the photoresist layer for a period of time;

c) exposing the photoresist layer from a top surface thereof to a dose of ultraviolet radiation through a mask having a predetermined pattern, controlling an intensity of the dose of ultraviolet radiation and controlling a time the photoresist layer is exposed to the dose of radiation such that a top portion of the photoresist layer through which the dose of ultraviolet radiation enters the photoresist layer undergoes greater cross linking than a bottom portion of the photoresist layer immediately adjacent to the top surface of the substrate such that a cross linking gradient develops through a thickness of the photoresist layer;

d) removing the mask, e) heating the photoresist layer for another period of time again; and f) dipping the substrate and photoresist into a developer solution, and detaching the membrane from the top surface of the substrate to form a free standing patterned membrane having a preselected pattern of open pores reflective of the pattern of the mask.

There is also provided a method of fabrication of free standing polymeric membranes using a positive photoresist, comprising the steps of:

a) providing a transparent substrate having a top surface and applying a positive photoresist layer to the top surface of the substrate;

b) heating the photoresist layer for a period of time;

c) exposing the photoresist layer from its top to a dose of ultraviolet radiation through a mask having a predetermined pattern such that exposure causes scission of polymer chains in portions of the photoresist layer exposed to the dose of ultraviolet radiation;

d) exposing the photoresist layer from its bottom to a dose of ultraviolet radiation without using any photomask, the dose of ultraviolet radiation being controlled in intensity and time the photoresist layer is exposed such that scission of the polymer chains only occurs at a bottom portion of the photoresist layer through which the dose of ultraviolet radiation enters the photoresist layer (as a result, the bottom portion of the photoresist layer becomes soluble during the subsequent development;

e) removing the mask, and f) dipping the substrate and photoresist into a developer solution, and detaching the membrane from the top surface of the substrate to form a free standing patterned membrane having a preselected pattern of open pores.

The present invention also provides a method of fabrication of a composite material comprised of nanoparticles (NPs) and the free standing porous membranes by using the membranes as templates to confine the movement of the nanoparticles, wherein the free standing membranes are exposed to the nanoparticles wherein said nanoparticles are confined by the pores of the free standing membrane.

The pores have pre-selected size and shape to provide a shape selective filter.

A further understanding of the functional and advantageous aspects of the invention can be realized by reference to the following detailed description and drawings.

BRIEF DESCRIPTION OF THE DRAWINGS

Preferred embodiments will now be described, by way of example only, with reference to the drawings, in which:

FIG. 3a shows a membrane with small circular pores made on the Si wafer; FIG. 3b shows a membrane with large circular pores made on the normal flat glass; FIG. 3c shows a membrane with hexagonal pores made on the polyethylene terephthalate (PET) film; FIGS. 3d, 3e, 3f shows membranes with elliptical pores, triangular pores and the letters "UWO" made on the glass slides of microscope.

FIG. 4b shows a photographic image of a piece of a membrane with thickness less than 20 μm unfolding evenly; FIG. 4b shows an SEM image demonstrating the flexibility and the micro scale flatness of membrane in which the flatness is further displayed by a zoom in view, showing that the area of trenches transits smoothly to the pores; FIG. 4c shows the profile of pores in membranes shows pores were distributed evenly among the crosslinked photoresist, and the inner walls of those pores are smooth; FIG. 4d shows the size of the pores do not change appreciably from the top to the bottom through the thickness of the membrane.

FIG. 5a shows the scan area of the large image is 3×3 μm² while the scan area of the inset is 30×30 μm², the white open square in the inset indicates the area scanned for the large image; FIG. 5b shows the height profile across the dotted line shows that the roughness is within ±10 nm.

FIG. 6 shows statistical results of self-detached membranes in which FIG. 6a is a plot showing membrane thickness versus exposure time during the cross linking step and shows the thickness of the detached membranes gradually decreased when the exposure time was reduced; FIG. 6b shows the thinner the membrane (lesser exposure dose), the greater the deviation of pore size came from the designed pore size of the photomask.

DETAILED DESCRIPTION

Generally speaking, the embodiments described herein are directed to a method of fabrication of free standing membranes and synthesis of nanoparticle patterns using the free standing porous membranes. As required, embodiments of the present invention are disclosed herein. However, the disclosed embodiments are merely exemplary, and it should be understood that the invention may be embodied in many various and alternative forms.

The figures are not to scale and some features may be exaggerated or minimized to show details of particular elements while related elements may have been eliminated to prevent obscuring novel aspects. Therefore, specific structural and functional details disclosed herein are not to be interpreted as limiting but merely as a basis for the claims and as a representative basis for teaching one skilled in the art to variously employ the present invention. For purposes of teaching and not limitation, a method of fabrication of free standing membranes and synthesis of nanoparticle patterns is disclosed herein.

As used herein, the terms "about", and "approximately" when used in conjunction with ranges of dimensions, concentrations, temperatures or other physical or chemical properties or characteristics is meant to cover slight variations that may exist in the upper and lower limits of the ranges of properties/characteristics.

As used herein, the phrase "negative photoresist" refers to a polymer photoresist material which, under exposure to UV light causes the negative resist to become polymerized, and more difficult to dissolve. Therefore, the exposed part of the negative resist remains on the surface of the substrate it is located on where it is exposed, and a developer solution is used to remove only the unexposed portions.

As used herein, the phrase "postive photoresist" refers to a polymer photoresist material that behaves in the opposite manner to a negative photoresist, such that, exposure to UV light changes the chemical structure of the resist so that it becomes more soluble in the developer. The exposed resist is then washed away by the developer solution.

As used herein, the phrase "scission" means breaking down of the polymer chains under UV exposure.

The present invention provides a novel and easy to control fabrication technique for preparing self-detachable, open-pore membranes synthesized from photocurable resist using a one-step photolithography process.

Figure 1:
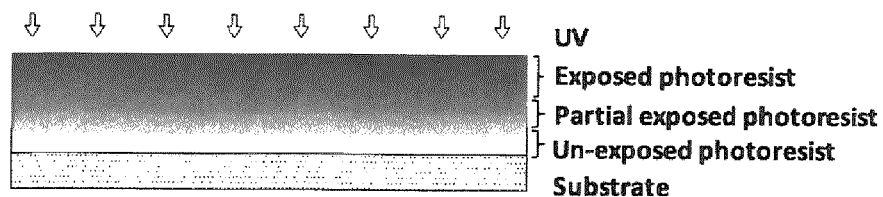
FIG. 1 is a schematic representation of a gradient of the cross linking process of a photoresist under UV exposure forming part of the present process.

The present method uses precise control of exposure dose on the photoresist, which induces the membranes to detach from the substrate. When a negative photoresist is used, as illustrated in FIG. 1, as the UV light shines through the photoresist perpendicularly from the top surface to the bottom surface, the top part of the sample absorbs UV energy and cross links in prior to the bottom surface. Only if the impinging UV energy is enough, the catalyzer of the photopolymerization diffuses to the bottom region, inducing cross linking of the completed sample. This gradient cross linking mechanism can be utilized to fabricate the self-detached and patterned membrane. The UV dose for sample was controlled so that the bottom region without cross linking was dissolved in the chemical developing process, while the cross linking top region was cured and detached from the substrate. The membrane thickness depends on the ratio of cross linking photoresist and un-cross linking photoresist, in other word, the amount of UV dose.

To emphasise, the factor key to obtaining the self-detachment of the membrane is to produce a gradient of UV exposure in the photoresist. In traditional photolithography, a specific amount of UV dose is required in order to make completed crosslink throughout the photoresist layer. However, in this so-called moderate photolithographic method, the amount of UV dose is less than the standard UV dose, for the particular purpose of generating a gradient of UV dose received inside the photoresist. As a result, a gradient degree of crosslinking is formed in the vertical direction of the photoresist.

Figure 2:
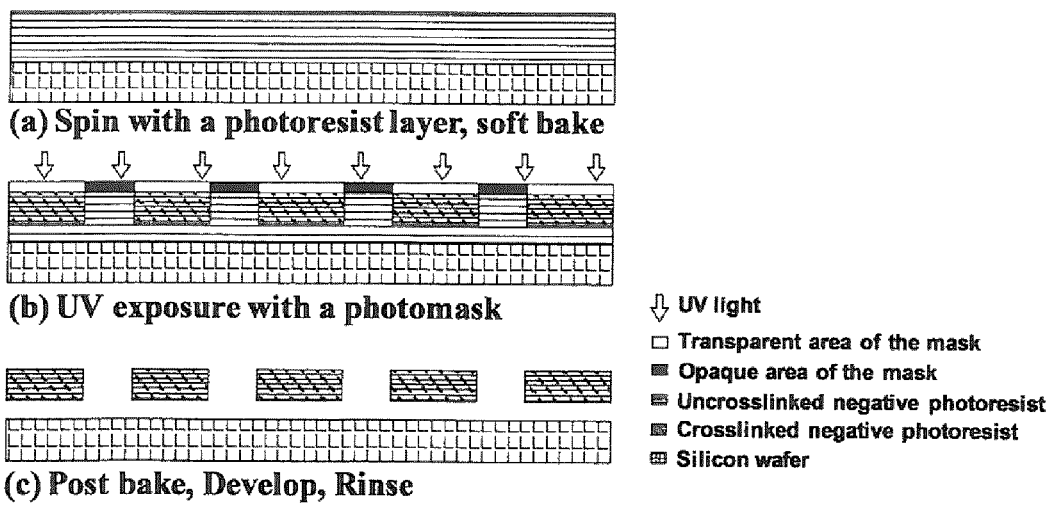
FIG. 2 is a schematic representation of a method of membrane fabrication using negative photoresist according to the present invention.

Referring to FIGS. 1 and 2, as the UV light shines perpendicularly into a layer of the negative photoresist from its top surface to its bottom surface through a mask (having a desired pattern for producing a corresponding pattern of pores in the final membrane), the top part of the photoresist absorbs the required amount of UV energy to generate enough protonic acid to crosslink the top part of the photoresist. The cured surface layer becomes thicker as the photosensitizer concentration increases, thereby blocking more UV light being transmitted downward toward the bottom surface adjacent to the top surface of the substrate. Only when the incident UV dose is high enough, the catalyzer of the photopolymerization diffuses to the bottom region, inducing crosslinking of the entire layer of the photoresist. Therefore, a photoresist layer with a gradient degree of crosslinking is formed as shown in FIG. 1.

The bottom region of the photoresist remained uncrosslinked, and thus it could be dissolved by the developer solution. On the contrary, the crosslinked top region forms the body of the membrane and is detached from the substrate to produce the free standing porous membrane. Using this method, high density pore arrays can be fabricated as easily as the low density ones as long as photolithography technique allows.

The present invention will now be illustrated with the following non-limiting but exemplary examples.

EXAMPLE 1

In a first example, SU-8, a negative photoresist, was used to produce the membranes and photolithography through a mask was used to define the micropatterns. SU-8 is a negative photoresist type epoxy, is widely used in the microfabrication of biological devices because of its hydrophobicity and biocompatibility.

The fabrication process is as follows. Silicon wafers were first carefully cleaned in the heated piranha solution, rinsed in DI water and dried on a hotplate (200° C.) for 5 min. The negative photoresist (SU-8 3010, Microchem, USA) was spun at 500 rpm for 5 sec followed by 1000 rpm for 30 sec on the clean Si wafer using a spin coater (Solitec 5110 Spinner). 5 min soft baking at 95° C. was needed to remove the excess solvent from the SU-8 layer. Then the SU-8 layer was exposed to UV light through a photomask using a mask aligner (Karl SussMA6 Mask Aligner, sensor wavelength=365 nm, UV intensity 6 mw cm$^{-2}$). After the post-exposure bake at 65° C. for 1 min and 95° C. for 3 min, the SU-8 layer was developed using the SU-8 developer with manual agitation. Ultrasonic agitation can help and speed up the process of development by disrupting the dissolved SU-8 at the edges to allow chemical contact between the developer and the SU-8 at the centre. Gradually, the patterned membranes were detached from the wafer and floated in the solution. It took another 30 sec to fully dissolve the uncrosslinked photoresist around the pores, and then the membrane was taken out from the developer and rinsed with isopropanol followed by deionised water. Finally, the membranes were laid on flat surfaces and covered with glass slides. to prevent the membranes from curving during the dehydration step.

Figure 3:
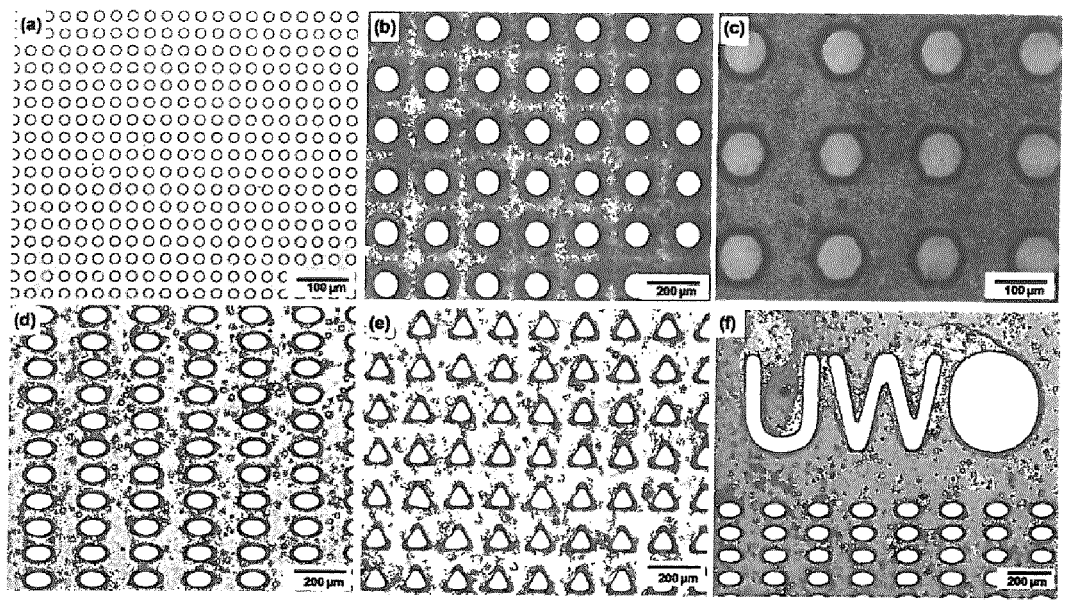
FIGS. 3a to 3f show optical microscope images of membranes with different sizes and shapes of pores made on various substrates.

The pore size of membranes can be accurately controlled using this method. The membrane in FIG. 3a demonstrates a porosity of $1.2 \times 10^5$ pores cm$^{-2}$ and its mean pore diameter (M) is 20 μm with a standard deviation (σ) of 30 nm. The coefficient of variation (CV=σ/M) is only 0.15%. This is a major advantage in comparison with track-etched membranes that show a CV of 15%-20%, and even better than microfiltration membranes (7%) built with aperture array lithography. Accuracy is ensured by two mechanisms. Firstly, the photolithography technique can pattern microstructures in accordance with the patterns on photomasks. Secondly, the self-detached mechanism guarantees that the patterned pores are not deformed when the membranes are separated from their substrates. The accuracy of pore size dominates the retention R, which is one of the vita parameters characterizing membrane selectivity. The retention can be determined by comparing the concentration of substance i retained $s_{i,r}$ and feeded $s_{i,f}$. The retention R, is defined as $s_{i,r}/s_{i,f}$, so it can be altered from 0, which means no retention of substance i, to 1, which indicates substance i is completely retained. The ratio of substance size to pore size provides the major contribution to this variation. Therefore, the retention of our membranes can be adjusted by precisely adjusting the pore size, which greatly increases the controllability of retention.

The useful features of this method are not only the accurately defined pore sizes, but also the uniformly distributed pores. The percentage of overlapped pores of the present membranes was controlled as about 0%, which is a very significant improvement over most of the existing commercial porous membranes. Furthermore, such uniformity remains not only within one piece of membrane, but also for different batches of membranes. The excellent uniformity and reproducibility are due to the stability of photolithography, and are further consolidated by the self-detachment mechanism disclosed herein. Besides the accuracy of pore size and uniformity of pores distribution, the pore shape can be well-defined as well, which may yield novel barrier structure, and thus further enhance the robustness of retention.

This porous barrier could be used in the precise permselective separations for substances that have subtle difference in size, but obvious difference in shape. Suppose that a kind of round shaped substance were extracted from another kind of hexagonal substance with the same size. This is not possible using size-based membranes, but the present shape-based membranes provide an executive solution. This opens the possibility of developing a new mode of filtration based not only on the sizes of substances, but also on their shapes. Circular, hexagonal, elliptical, triangular pores and even letters were fabricated and demonstrated to verify the robustness of this method as shown in FIGS. 3a to 3f.

Figure 4:
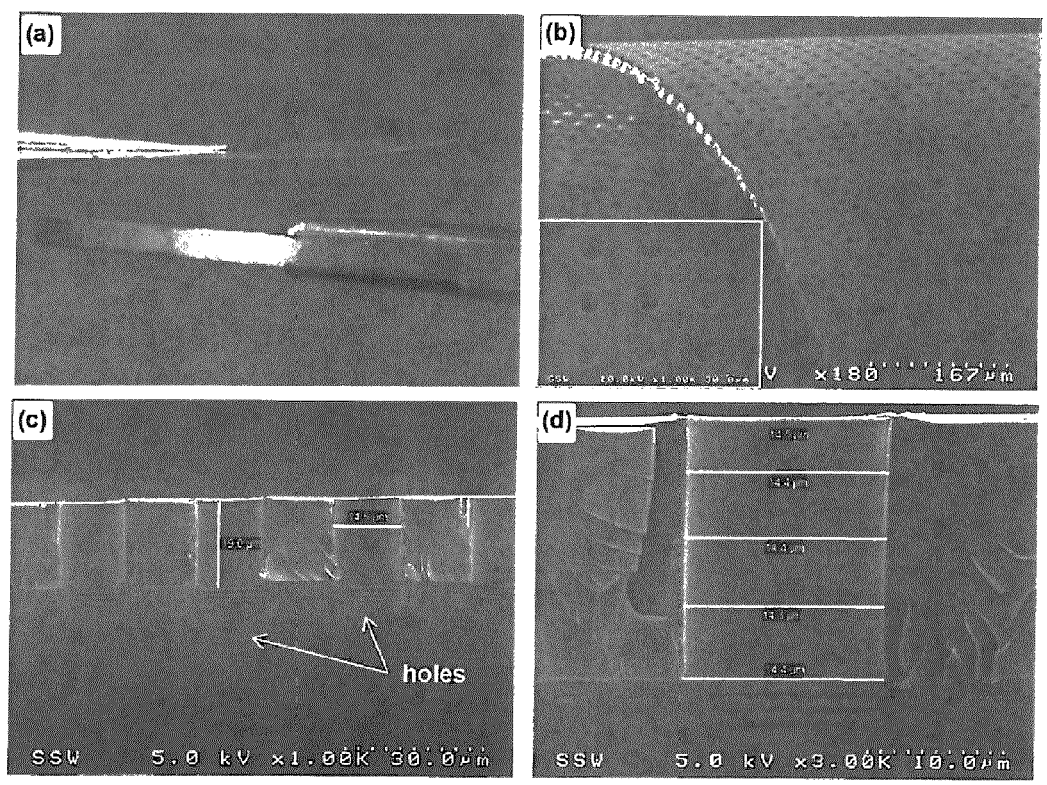
FIGS. 4a to 4d show optical microscope images of membranes.

Another useful feature of this method is the regularity of membranes. From the surfaces to the internal walls of pores, the whole piece of membrane was perfectly fabricated without any discernible defects. As shown in FIG. 4a, a piece of membrane with a thickness of 20 μm can easily remain flat and smooth.

Figure 5:
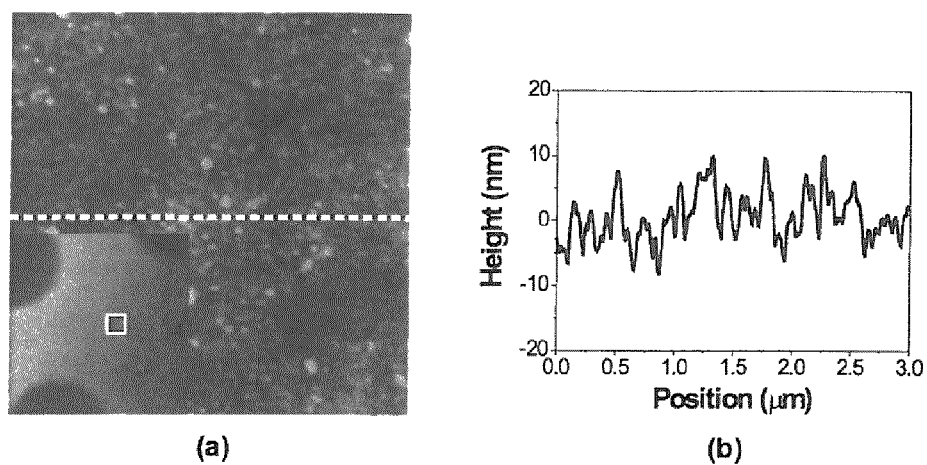
FIG. 5 shows topography representations and section analysis of AFM measurements of membranes.

If such a thin membrans were detached from a mold or a substrate by exotic methods, it would very likely be distorted or even damaged by the external force or the residual stress. However, as shown in FIG. 4b, the self-detached membrane remains intact. The smoothness of the membrane surface was further quantified at nanoscale using atomic force microscopy (AFM). The topography of SU-8 membranes is shown in FIG. 5a and a height profile is provided as its section analysis in FIG. 5b. Characterized from AFM data, the roughness of membranes was just within ±10 nm. The regularity is also displayed by the the profile of pores. FIG. 4c shows that the pores are distributed evenly in the membrane and the inner walls of those pores are smooth. The axes of pores were parallel to the normal of membrane surface. From an enlarged view of the inner wall (FIG. 4d), we can see that the diameter and shape of the pores remain nearly unchanged throughout the pores in the depth direction. These merits of membranes can reduce the possibility of the formation of a particle aggregation across the pore constriction when particles, smaller in size than the pore, simultaneously pass through the pore. This leads to the high flux in the application of filtration. These robust membranes can be built on a variety of substrates. For example, the membranes in FIGS. 3a to 3f were fabricated on silicon wafers, regular flat glasses, polyethylene terephthalate (PET) films and microscope glass slides, respectively. The only difference among them is the flatness. As the flatness of the silicon wafer is greater than the other three, the membrane made on silicon wafer was flatter than the others, which is why the appearance of the membranes in FIG. 3a looks smoother and cleaner.

Figure 6:
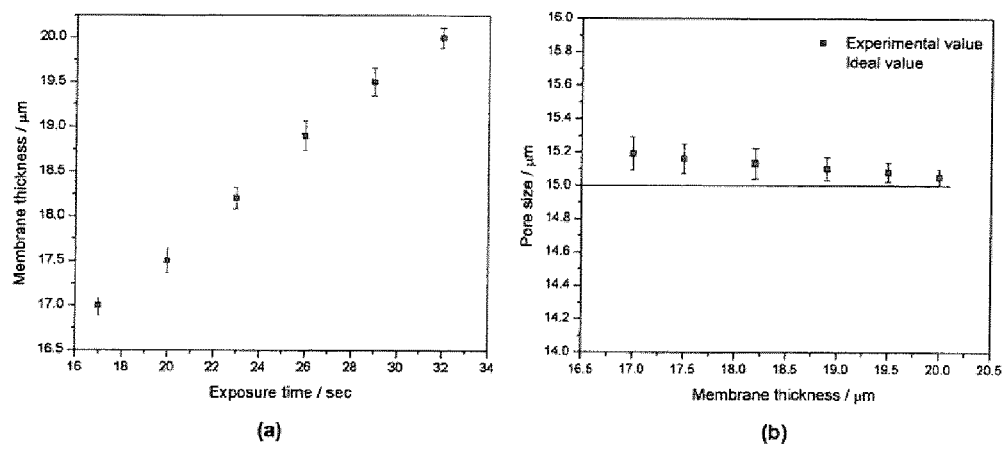

Control of thickness is a crucial factor in the creation of membranes. The thickness of self-detached membranes is proportional to the exposure dose of UV in this method. With a regular exposure time ($t_e$, 33 sec) for SU-8 3010 spun at 1000 rpm, a SU-8 layer of 21±0.3 μm can completely crosslink and adhere to its substrate. On the contrary, if the exposure dose were too low, the whole SU-8 layer would be totally dissolved in the developer. The self-detaching phenomenon occurred in the development step for $t_e$ shorter than 33 sec. FIG. 6a shows the relation of $t_e$ to the thicknesses of SU-8 membranes, which are measured by the Dektak Surface Profilometer. As the exposure time reduced, the thickness of the self-detached membranes gradually decreased. Therefore, one can infer that membranes with other thickness can be fabricated by adjusting the spinning speed for photoresist SU-8 or using other kinds of photoresist and applying different UV exposure dosage.

Since a lower UV dose was applied compared to the required UV dose for the traditional photolithography process, photoresist at the edges of pores might not crosslink completely, which may lead to partial dissolution when reacting with the developer. As a result, the pore size of membranes might become slightly larger than that of the photomask. It is delightful that such discrepancy is tiny and fits in a predictable trend. Based on experimental data, the relationship between membrane thickness and pore size is statistically shown in FIG. 6b. As seen from the data, the thinner the membranes were, the greater the deviation of actual pore size from the designed value. Knowing the correlation between membrane thickness and the relevant deviation of pore size, we can achieve the desired pore size by compensating the difference, i.e., by slightly reducing the pore size on the photomask.

EXAMPLE 2

Figure 7:
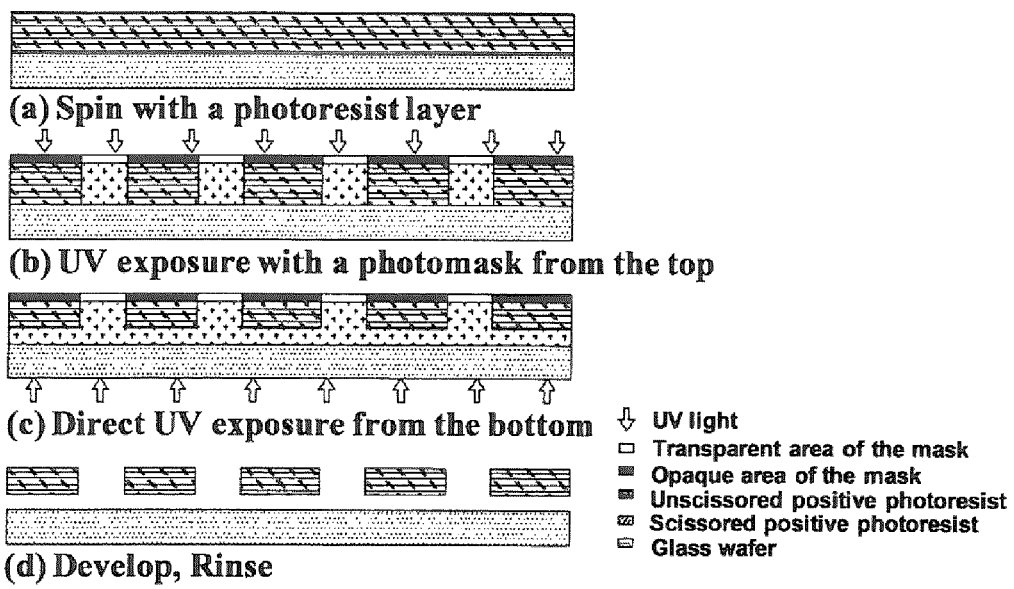
FIG. 7 is a schematic representation of a method of membrane fabrication using positive photoresist according to the present invention.

FIG. 7 shows the process of fabrication of membranes with positive photoresist in which most of the steps are similar to the process of using negative photoresist except the exposure step. The photoresist layer is exposed from its top to a dose of ultraviolet radiation through a mask having a predetermined pattern, exposure causes scission of the polymer chains at the top parts of the photoresist layer. Then this photoresist layer is exposed from its bottom to a dose of ultraviolet radiation without any photomask, the dose of ultraviolet radiation being controlled in intensity and time the photoresist layer is exposed such that scission of the polymer chains only occurs at a bottom portion of the photoresist layer through which the dose of ultraviolet radiation enters the photoresist layer The positive photoresist may be, but is not limited to, Polymethyl methacrylate (PMMA), Microposit 1800 Series, AZ Series.

Thus in this embodiment using a positive photoresist based polymer, the method of fabrication of free standing polymeric membranes comprising the steps of: a) providing a transparent substrate having a top surface and applying a positive photoresist layer to the top surface of the substrate; b) heating the photoresist layer for a period of time; c) exposing the photoresist layer from its top to a dose of ultraviolet radiation through a mask having a predetermined pattern such that exposure causes scission of polymer chains in portions of the photoresist layer exposed to the dose of ultraviolet radiation; d) exposing the photoresist layer from its bottom to a dose of ultraviolet radiation without any photomask, the dose of ultraviolet radiation being controlled in intensity and time the photoresist layer is exposed such that scission of the polymer chains only occurs at a bottom portion of the photoresist layer through which the dose of ultraviolet radiation enters the photoresist layer (as a result, the bottom portion of the photoresist layer becomes soluble during the subsequent development); e) removing the mask, and f) dipping the substrate and photoresist into a developer solution, and detaching the membrane from the top surface of the substrate to form a free standing patterned membrane having a preselected pattern of open pores.

EXAMPLE 3

Figure 8:
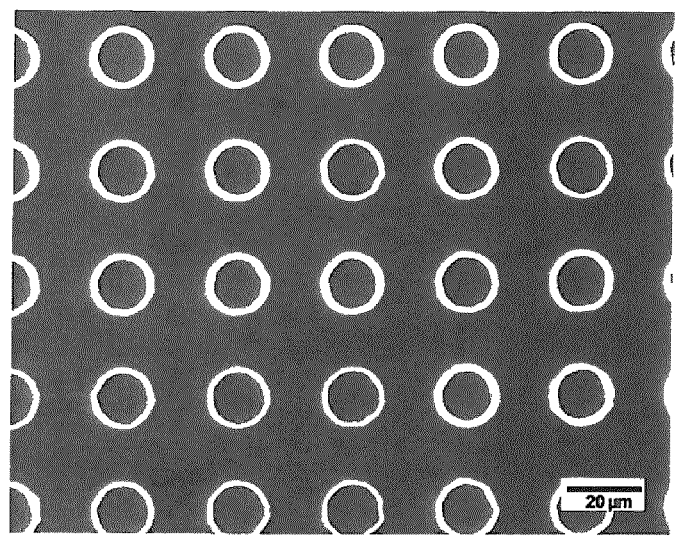
FIG. 8 is an image taken by blackfield optical microscope showing Ag nanparticle ring arrays patterned with freestanding membranes.
Figure 9:
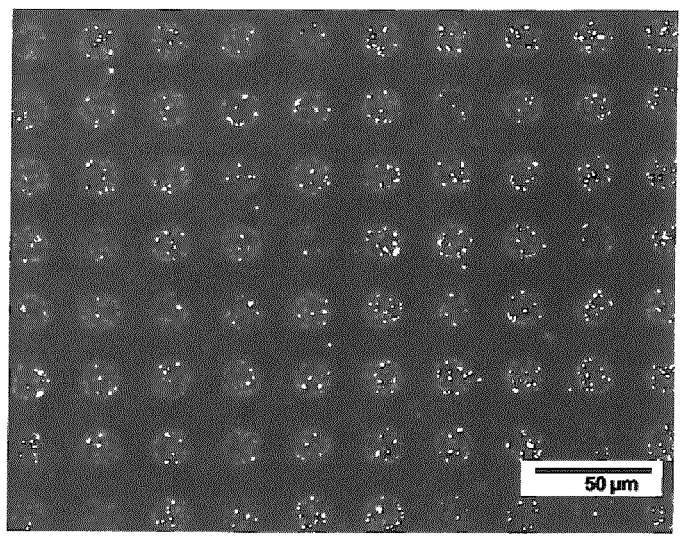
FIG. 9 is an optical image taken by blackfield optical microscope showing Ag nanoparticles in a disc array patterned with freestanding membranes.

Working as templates to confine the movement of nanoparticles (NPs), These membranes can be employed to pattern NPs array. Based on coffee ring effect, the particles in a droplet prefer flowing toward the perimeter under capillary forces, and that results in higher concentration of particles at the perimeter than other area in the droplet. Membranes were employed here to further define the boundary of NPs movement. They were attached on a flat surface, and NPs were distributed among those pores array by spraying. After evaporation, the NPs were patterned, and the membranes can be easily peeled off, leaving the NPs array. By changing the concentration of NPs solution used in spraying, NPs rings (FIG. 8) and NPs discs (FIG. 9) were built up uniformly with high repeatability. Various kinds of NPs patterns can be built up through membranes with different pore shapes.

The method is not limited to the materials referred to in the Examples. For example, the negative photoresist may be, but is not limited to, the SU-8 3000 Series, the SU-8 2000 Series, and the KMPR 1000 Series to mention just a few. The substrate may be any solid including semiconductors such as but not limited to silicon wafers. It may be any polymer material, glasses, metals, glass slides, vinyl sheets, mica, graphite and any plastic to mention just a few. The developer solution may be 1-Methoxy-2-propyl acetate, or TMAH aqueous alkaline developer, or Methyl Isobutyl Ketone (MIBK) and isoproponal and Microposit MF 319 Developer, to mention just a few. Besides spraying, any other method of applying the nanoparticles may be used including dip coating, spin coating and plating methodologies to mention a few non-limiting techniques.

The present method is very advantageous compared to existing commercial products or laboratory methods, in that the present method can be used to fabricate self-detached membranes with complicated patterns and varying thicknesses in a one step process. The present method does not involve handling any dangerous reagent. Due to the self-detached mechanism, the membranes made with this method are free of residual stress and deformation. This fabrication method is less expensive, but suitable for large-scale production. With these freestanding membranes, various NPs array are easily patterned by spraying.

In disclosed herein is a simple yet robust method to fabricate self-detached membranes of SU-8 with well-defined pore size, shape and distribution and with controllable thickness based on conventional photolithography. The essence of this method is that a gradient degree of cross-linking is formed in the photosensitive material, which results in self-detached membranes. Free standing membranes with specially tailored sizes and shapes of pores have been prepared on various substrates. Advantageously, due to the self-detaching mechanism, the membranes produced by this method are flat, and free of residual stress and deformation. Another important advantage is that accurate control of pore shape, such membranes enable filtration by shape compared to filtration by size for a majority of membranes. In summary, this simple photolithographic method opens a new avenue to fabricate high-performance membranes that enables broad applications in filtration, separation, sorting and even new means of filtration like filtration by shape.

As used herein, the terms "comprises", "comprising", "includes" and "including" are to be construed as being inclusive and open ended, and not exclusive. Specifically, when used in this specification including claims, the terms "comprises", "comprising", "includes" and "including" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A method of fabrication of self-detachable, free standing polymeric membranes of uniform thickness using negative photoresist, comprising the steps of:
    a) providing a substrate having a top surface and applying a negative photoresist layer to the top surface of the substrate, said photoresist layer having uniform thickness;
    b) heating the photoresist layer for a period of time;
    c) exposing the photoresist layer from a top surface thereof to a dose of ultraviolet radiation through a mask having a predetermined pattern, the dose of ultraviolet radiation being delivered perpendicularly into the photoresist layer;
    d) controlling an intensity of the dose of ultraviolet radiation and controlling a time the photoresist layer is exposed to the dose of radiation such that a top portion of the photoresist layer through which the dose of ultraviolet radiation enters the photoresist layer undergoes greater cross linking than a bottom portion of the photoresist layer immediately adjacent to the top surface of the substrate such that a cross linking gradient develops through a thickness of the photoresist layer;
    e) removing the mask,
    f) heating the photoresist layer for another period of time again; and
    g) dipping the substrate and photoresist into a developer solution, and detaching the cross linked photoresist from the top surface of the substrate to form a free standing patterned membrane of uniform thickness having a preselected pattern of open pores reflective of the pattern of the mask.

2. The method according to claim 1 wherein said substrate is selected from the group consisting of silicon wafers, glass slides, vinyl sheets, metal plates, mica, graphite and any plastic.

3. The method according to claim 1 wherein said developer solution is selected from the group consisting 1-Methoxy-2-propyl acetate, and TMAH aqueous alkaline developer.

* * * * *